United States Patent
Han et al.

[11] Patent Number: 6,091,589
[45] Date of Patent: Jul. 18, 2000

[54] SOFT ADJACENT LAYER (SAL) MAGNETORESISTIVE (MR) SENSOR ELEMENT WITH ELECTRICALLY INSULATED SOFT ADJACENT LAYER (SAL)

[75] Inventors: Cherng-Chyi Han; Mao-Min Chen, both of San Jose; Chien-Li Lin, Fremont; Kochan Ju; Cheng Tzong Horng, both of San Jose, all of Calif.

[73] Assignee: Headway Technologies, Inc., Milpitas, Calif.

[21] Appl. No.: 09/320,756

[22] Filed: May 27, 1999

Related U.S. Application Data

[62] Division of application No. 08/810,060, Mar. 5, 1997, Pat. No. 5,920,980.

[51] Int. Cl.[7] .................................. G11B 5/39; G01B 7/14
[52] U.S. Cl. ........................................................ 360/327.22
[58] Field of Search ............................. 360/113; 324/252, 324/207.21; 338/32 R

[56] References Cited

U.S. PATENT DOCUMENTS

| | | |
|---|---|---|
| 3,864,751 | 2/1975 | Beaulieu et al. ........................ 360/113 |
| 4,024,489 | 5/1977 | Bajorek et al. ........................... 338/32 |
| 4,713,708 | 12/1987 | Krounbi et al. ......................... 360/113 |
| 4,879,619 | 11/1989 | Fontana, Jr. et al. ................... 360/113 |
| 5,406,433 | 4/1995 | Smith ...................................... 360/113 |
| 5,532,892 | 7/1996 | Nix et al. ................................ 360/113 |
| 5,644,456 | 7/1997 | Smith et al. ............................ 360/113 |
| 5,753,131 | 5/1998 | Choukh et al. ........................... 216/22 |

*Primary Examiner*—George J. Letscher
*Attorney, Agent, or Firm*—George O. Saile; Stephen B. Ackerman; Alek P. Szecsy

[57] ABSTRACT

Within a soft adjacent layer (SAL) magnetoresistive (MR) sensor element which may be employed within a magnetic head there is first employed a substrate. Formed over the substrate is a soft adjacent layer (SAL). In turn, formed upon the soft adjacent layer (SAL) is a dielectric layer. Finally, in turn, formed at least in part upon the dielectric layer is a magnetoresistive (MR) layer. Within the soft adjacent layer (SAL) magnetoresistive (MR) sensor element the soft adjacent layer (SAL) and the dielectric layer are planar. In addition, within the soft adjacent layer (SAL) magnetoresistive (MR) sensor element both an upper surface of the magnetoresistive (MR) layer and a lower interface of the magnetoresistive (MR) layer are non-planar.

8 Claims, 5 Drawing Sheets

SOFT ADJACENT LAYER (SAL) MAGNETORESISTIVE (MR) SENSOR ELEMENT WITH ELECTRICALLY INSULATED SOFT ADJACENT LAYER (SAL)

CROSS-REFERENCE TO RELATED APPLICATION

This application is a division of application Ser. No. 08/810,060, filed Mar. 5, 1997, now U.S. Pat. No. 5,920,980, issued Jul. 13, 1999.

BACKGROUND OF THE INVENTION

1. Field of the Invention

The present invention relates generally to methods for fabricating magnetic sensor elements. More particularly, the present invention relates to methods for fabricating soft adjacent layer (SAL) magnetoresistive (MR) sensor elements.

2. Description of the Related Art

The recent and continuing advances in computer and information technology have been made possible not only by the correlating advances in the functionality, reliability and speed of semiconductor integrated circuits, but also by the correlating advances in the storage density and reliability of direct access storage devices (DASDs) employed in digitally encoded magnetic data storage and retrieval.

Storage density of direct access storage devices (DASDs) is typically measured as areal storage density of a magnetic data storage medium formed upon a rotating magnetic data storage disk within a direct access storage device (DASD) magnetic data storage enclosure. The areal storage density of the magnetic data storage medium is defined largely by the track width, the track spacing and the linear magnetic domain density within the magnetic data storage medium. The track width, the track spacing and the linear magnetic domain density within the magnetic data storage medium are in turn determined by several principal factors, including but not limited to: (1) the magnetic read-write characteristics of a magnetic read-write head employed in reading and writing digitally encoded magnetic data into and from the magnetic data storage medium; (2) the magnetic domain characteristics of the magnetic data storage medium; and (3) the separation distance of the magnetic read-write head from the magnetic data storage medium.

With regard to the magnetic read-write characteristics of magnetic read-write heads employed in reading and writing digitally encoded magnetic data into and from a magnetic data storage medium, it is known in the art of magnetic read-write head fabrication that magnetoresistive (MR) read-write heads are generally superior to other types of magnetic read-write heads when employed in retrieving digitally encoded magnetic data from a magnetic data storage medium. In that regard, magnetoresistive (MR) read-write heads are generally regarded as superior since magnetoresistive (MR) read-write heads are known in the art to provide high output digital read signal amplitudes, with good linear resolution, independent of the relative velocity of a magnetic data storage medium with respect to a magnetoresistive (MR) read-write head.

In order to optimize signal amplitude and performance of a magnetoresistive (MR) read-write head, it is known in the art of magnetoresistive (MR) read-write head fabrication to employ at least either: (1) a longitudinal magnetic biasing to a magnetoresistive (MR) layer within a magnetoresistive (MR) sensor element within the magnetoresistive (MR) read-write head (in order to provide noise free operation of the magnetoresistive (MR) sensor element); or (2) a transverse magnetic biasing to the magnetoresistive (MR) layer within the magnetoresistive (MR) sensor element within the magnetoresistive (MR) read-write head (in order to provide a linear response of the magnetoresistive (MR) sensor element). Longitudinal magnetic biasing is typically provided through antiferromagnetic coupling of patterned antiferromagnetic material layers contacting opposite ends of the magnetoresistive (MR) layer within the magnetoresistive (MR) sensor element, while transverse magnetic biasing is typically provided through forming either in contact with or separated from the magnetoresistive (MR) layer by a conductor spacer layer a soft adjacent layer (SAL) of soft magnetic material, typically at least substantially co-extensive with the magnetoresistive (MR) layer within the magnetoresistive (MR) sensor element.

While transverse magnetically biased soft adjacent layer (SAL) magnetoresistive (MR) sensor elements provide generally enhanced linearity and performance with respect to otherwise equivalent magnetoresistive (MR) sensor elements absent soft adjacent layer (SAL) transverse magnetic biasing, soft adjacent layer (SAL) magnetoresistive (MR) sensor elements are not entirely without problems. In particular, soft adjacent layer (SAL) magnetoresistive (MR) sensor elements when conventionally fabricated with a conductor spacer layer or soft adjacent layer (SAL) contacting a magnetoresistive (MR) layer within the soft adjacent layer (SAL) magnetoresistive (MR) sensor element suffer from problems including but not limited to: (1) current shunting through either or both the conductor spacer layer and the soft adjacent layer (SAL) (which leads to reduced signal amplitude of the magnetoresistive (MR) sensor element); and (2) thermal annealing induced elemental interdiffusion of the conductor spacer layer or the soft adjacent layer (SAL) with the magnetoresistive (MR) layer (which similarly also leads to reduced signal amplitude of the magnetoresistive (MR) sensor element). It is thus towards the goal of fabricating soft adjacent layer (SAL) magnetoresistive (MR) sensor elements which simultaneously avoid: (1) current shunting into conductor spacer layers or soft adjacent layers (SALs) adjoining magnetoresistive (MR) layers within the soft adjacent layer (SAL) magnetoresistive (MR) sensor elements; and (2) thermal annealing induced elemental interdiffusion of conductor spacer layers or soft adjacent layers (SALs) adjoining magnetoresistive (MR) layers within those soft adjacent layer (SAL) magnetoresistive (MR) sensor elements that the present invention is generally directed.

Various soft adjacent layer (SAL) magnetoresistive (MR) sensor elements have been disclosed in the art of magnetoresistive (MR) sensor element fabrication.

For example, Beaulieu et al., in U.S. Pat. No. 3,864,751 disclose a soft adjacent layer (SAL) magnetoresistive (MR) sensor element comprising a magnetoresistive (MR) layer separated from a soft adjacent layer (SAL) by a dielectric layer. The soft adjacent layer (SAL) magnetoresistive (MR) sensor element provides for independent electrical biasing of the soft adjacent layer (SAL) with respect to the magnetoresistive (MR) layer.

In addition, Bajorek et al., in U.S. Pat. No. 4,024,489 disclose a soft adjacent layer (SAL) magnetoresistive (MR) sensor element comprising a magnetoresistive (MR) layer separated from a soft adjacent layer (SAL) by a relatively high resistivity conductor layer. The soft adjacent layer (SAL) magnetoresistive (MR) sensor element so formed avoids dielectric breakdown problems and spurious signal problems observed within the soft adjacent layer (SAL) magnetoresistive (MR) sensor element disclosed by Beaulieu et al.

Further, Krounbi et al., in U.S. Pat. No. 4,713,708 discloses a soft adjacent layer (SAL) magnetoresistive (MR) sensor element comprising a magnetoresistive (MR) layer having a central region separated from a soft adjacent layer (SAL) by a tantalum spacer layer, while a pair of end regions of the magnetoresistive (MR) layer contact the soft adjacent layer (SAL) The magnetoresistive (MR) layer is further longitudinally magnetically biased through patterned antiferromagnetic longitudinal magnetic bias layers coupled with the end regions of the magnetoresistive (MR) layer.

Yet further, Fontana Jr., et al., in U.S. Pat. No. 4,879,619 disclose a soft adjacent layer (SAL) magnetoresistive (MR) sensor element comprising a magnetoresistive (MR) layer separated from a soft adjacent layer (SAL) by a spacer layer formed from a nichrome alloy or a nichrome alloy doped with chromium oxide. Within the soft adjacent layer (SAL) magnetoresistive (MR) sensor element so formed, the resistivity of the spacer layer may be variably adjusted.

Finally, Nix et al., in U.S. Pat. No. 5,532,892 disclose a soft adjacent layer (SAL) magnetoresistive (MR) sensor element comprising a magnetoresistive (MR) layer having a permanent magnet layer formed at each of its ends, where the magnetoresistive (MR) layer and the permanent magnet layers are separated by a tantalum or titanium spacer layer from a soft adjacent layer (SAL). The soft adjacent layer (SAL) magnetoresistive (MR) sensor element so formed has a natural magnetic flux closure design.

Desirable in the art of soft adjacent layer (SAL) magnetoresistive (MR) sensor element fabrication are additional soft adjacent layer (SAL) magnetoresistive (MR) sensor elements which avoid: (1) signal amplitude degradation due to current shunting of conductor spacer layers or soft adjacent layers (SALs) contacting magnetoresistive (MR) layers within those soft adjacent layer (SAL) magnetoresistive (MR) sensor elements; and (2) signal amplitude degradation due to thermal annealing induced elemental interdiffusion of magnetoresistive (MR) layers with conductor spacer layers or soft adjacent layers (SALs) contacting those magnetoresistive (MR) layers within those soft adjacent layer (SAL) magnetoresistive (MR) sensor elements. More desirable in the art are soft adjacent layer (SAL) magnetoresistive (MR) sensor elements which achieve the foregoing objects while simultaneously being readily manufacturable. Most desirable in the art are soft adjacent layer (SAL) magnetoresistive (MR) sensor elements which achieve the foregoing objects while being readily manufacturable and avoiding problems as inherent within soft adjacent layer (SAL) magnetoresistive (MR) sensor elements as disclosed by Beaulieu et al. and discussed within Bajorek et al., above. The teachings of Beaulieu et al. and Bajorek et al. are incorporated herein fully by reference. It is towards the foregoing goals that the present invention is more specifically directed.

SUMMARY OF THE INVENTION

A first object of the present invention is to provide a soft adjacent layer (SAL) magnetoresistive (MR) sensor element and a method for fabricating the soft adjacent layer (SAL) magnetoresistive (MR) sensor element, wherein there is avoided signal amplitude degradation of the soft adjacent layer (SAL) magnetoresistive (MR) sensor element due to current shunting through a conductor spacer layer or soft adjacent layer (SAL) contacting the magnetoresistive (MR) layer within the soft adjacent layer (SAL) magnetoresistive (MR) sensor element.

A second object of the present invention is to provide a soft adjacent layer (SAL) magnetoresistive (MR) sensor element and a method for fabricating the soft adjacent layer (SAL) magnetoresistive (MR) sensor element, wherein there is avoided signal amplitude degradation of the soft adjacent layer (SAL) magnetoresistive (MR) sensor element due to elemental interdiffusion of a conductor spacer layer or soft adjacent layer (SAL) contacting the magnetoresistive (MR) layer within the soft adjacent layer (SAL) magnetoresistive (MR) sensor element.

A third object of the present invention is to provide a soft adjacent layer (SAL) magnetoresistive (MR) sensor element in accord with the first object of the present invention or the second object of the present invention, where the method through which is fabricated the soft adjacent layer (SAL) magnetoresistive (MR) sensor element is readily manufacturable.

A fourth object of the present invention is to provide a soft adjacent layer (SAL) magnetoresistive (MR) sensor element in accord with the first object of the present invention or the second object of the present invention, where there is avoided problems as inherent within the soft adjacent layer (SAL) magnetoresistive (MR) sensor element as disclosed by Beaulieu et al. and discussed within Bajorek et al., above.

In accord with the objects of the present invention, there is provided by the present invention a soft adjacent layer (SAL) magnetoresistive (MR) sensor element and a method for fabricating the soft adjacent layer (SAL) magnetoresistive (MR) sensor element. To practice the method of the present invention, there is first provided a substrate. There is formed over the substrate a soft adjacent layer (SAL). There is then formed upon the soft adjacent layer a dielectric layer. Finally, there is then formed at least in part upon the dielectric layer a magnetoresistive (MR) layer, where the soft adjacent layer (SAL) and the dielectric layer are planar. The method of the present invention contemplates the soft adjacent layer (SAL) magnetoresistive (MR) sensor element formed through the method of the present invention.

There is provided through the present invention a soft adjacent layer (SAL) magnetoresistive (MR) sensor element, where there is avoided signal amplitude degradation of the soft adjacent layer (SAL) magnetoresistive (MR) sensor element due to either: (1) current shunting through a conductor spacer layer or soft adjacent layer (SAL) contacting the magnetoresistive (MR) layer within the soft adjacent layer (SAL) magnetoresistive (MR) sensor element; or (2) thermal annealing induced elemental interdiffusion of a conductor spacer layer or soft adjacent layer (SAL) contacting the magnetoresistive (MR) layer within the soft adjacent layer (SAL) magnetoresistive (MR) sensor element. The present invention realizes the foregoing objects by forming within the soft adjacent layer (SAL) magnetoresistive (MR) sensor element of the present invention a magnetoresistive (MR) layer separated from a soft adjacent layer (SAL) by a dielectric spacer layer rather than a conductor spacer layer.

There is provided by the present invention a soft adjacent layer (SAL) magnetoresistive (MR) sensor element where there is also avoided problems as inherent within the soft adjacent layer (SAL) magnetoresistive (MR) sensor element as disclosed by Beaulieu et al. and discussed within Bajorek et al., above. The present invention realizes the foregoing object by forming within the soft adjacent layer (SAL) magnetoresistive (MR) sensor element of the present invention the soft adjacent layer (SAL) and the dielectric spacer layer as planar layers.

The method through which is formed the soft adjacent layer (SAL) magnetoresistive (MR) sensor element of the present invention is readily manufacturable. As is illustrated within the preferred embodiment of the present invention, the soft adjacent layer (SAL) magnetoresistive (MR) sensor element of the present invention may be formed through a photolithographic and etch method employing fabrication apparatus generally known within the art of magnetic read-write head fabrication. Thus, the method through which is formed the soft adjacent layer (SAL) magnetoresistive (MR) sensor element of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a soft adjacent layer (SAL) magnetoresistive (MR) sensor element and a method for fabricating the soft adjacent layer (SAL) magnetoresistive (MR) sensor element, where there is avoided within the soft adjacent layer (SAL) magnetoresistive (MR) sensor element signal amplitude degradation due to either: (1) current shunting through a conductor spacer layer or soft adjacent layer (SAL) contacting the magnetoresistive (MR) layer within the soft adjacent layer (SAL) magnetoresistive (MR) sensor element; or (2) elemental interdiffusion of a conductor spacer layer or soft adjacent layer (SAL) contacting the magnetoresistive (MR) layer within the soft adjacent layer (SAL) magnetoresistive (MR) sensor element, while simultaneously avoiding problems as inherent within the soft adjacent layer (SAL) magnetoresistive (MR) sensor element as disclosed by Beaulieu et al. and discussed within Bajorek et al., above. The present invention realizes the foregoing objects by forming within the soft adjacent layer (SAL) magnetoresistive (MR) sensor element of the present invention a magnetoresistive (MR) layer separated from a soft adjacent layer (SAL) by a dielectric layer rather than a conductor layer, where the soft adjacent layer (SAL) and the dielectric layer are planar.

Although the soft adjacent layer (SAL) magnetoresistive (MR) sensor element of the present invention may be employed in fabricating soft adjacent layer (SAL) magnetoresistive (MR) sensors employed in various applications, including but not limited to analog magnetic signal sensing applications and digital magnetic signal sensing applications, the soft adjacent layer (SAL) magnetoresistive (MR) sensor element of the present invention is preferably employed within, and particularly suited to forming, a magnetoresistive (MR) read-write head employed in reading and writing digitally encoded magnetic data into and from a magnetic data storage medium employed within a direct access storage device (DASD) employed within digitally encoded magnetic data storage and retrieval.

Figure 1:
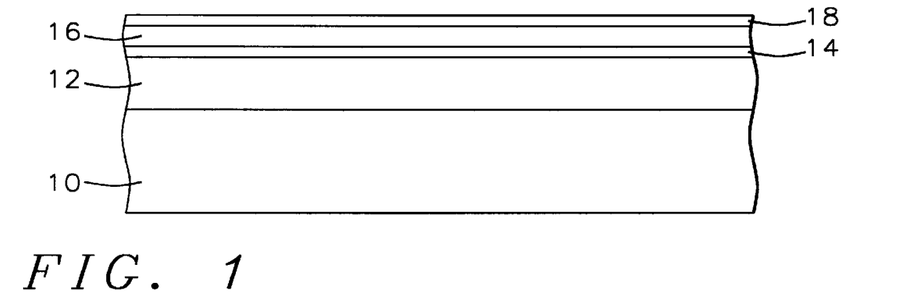
FIG. 1 to FIG. 6 show a series of schematic cross-sectional diagrams illustrating the results of progressive stages in forming a soft adjacent layer (SAL) magnetoresistive (MR) sensor element in accord with a first preferred embodiment of the present invention.

Referring now to FIG. 1 to FIG. 6, there is shown a series of schematic cross-sectional diagrams illustrating the results of progressive stages in forming a soft adjacent layer (SAL) magnetoresistive (MR) sensor element in accord with a first preferred embodiment of the present invention. Shown in FIG. 1 is a schematic cross-sectional diagram illustrating the soft adjacent layer (SAL) magnetoresistive (MR) sensor element at an early stage in its fabrication.

Shown in FIG. 1 is a substrate 10 having formed thereupon or thereover four blanket layers. The four blanket layers include: (1) a blanket shield layer 12 formed upon the substrate 10; (2) a blanket first dielectric layer 14 formed upon the blanket shield layer 12; (3) a blanket soft adjacent layer (SAL) 16 formed upon the blanket first dielectric layer 14; and (4) a blanket second dielectric spacer layer 18 formed upon the blanket soft adjacent layer (SAL) 16. Each of the foregoing substrate and four blanket layers may be formed through methods and materials as are common in the art of soft adjacent layer (SAL) magnetoresistive (MR) sensor element fabrication.

For example, although it is known in the art that substrates within soft adjacent layer (SAL) magnetoresistive (MR) sensor element fabrication are typically formed from non-magnetic ceramic materials such as but not limited to oxides, nitrides, borides, carbides and mixtures of oxides, nitrides, borides and carbides, for the preferred embodiment of the present invention, the substrate 10 is preferably formed from a non-magnetic aluminum oxide/titanium carbide material. Preferably, the substrate 10 so formed is formed with sufficient dimensions to allow the substrate 10 to be fabricated into a slider employed within a direct access storage device (DASD) magnetic data storage enclosure employed within digitally encoded magnetic data storage and retrieval.

Similarly, although it is also known in the art of soft adjacent layer (SAL) magnetoresistive (MR) sensor element fabrication that shield layers and soft adjacent layers (SALs) may be formed from any of several soft magnetic materials, including but not limited to permalloy (ie: nickel-iron alloy) soft magnetic materials and higher order alloy soft magnetic materials incorporating permalloy soft magnetic materials (ie: nickel-iron-rhodium soft magnetic materials and nickel-iron-chromium soft magnetic materials), for the preferred embodiment of the present invention, the blanket shield layer 12 and the blanket soft adjacent layer (SAL) 16 are each preferably formed of a permalloy (ie: nickel-iron 80:20 w/w) soft magnetic material. Preferably, the blanket shield layer 12 is formed to a thickness of from about 10000 to about 30000 angstroms, while the blanket soft adjacent layer (SAL) 16 is preferably formed to a thickness of from about 50 to about 500 angstroms.

Although not specifically illustrated in FIG. 1, in order to assure optimal magnetic saturation of the blanket soft adjacent layer (SAL) 16 and thus assure optimal performance of the soft adjacent layer (SAL) magnetoresistive (MR) sensor element of the first preferred embodiment of the present invention, it is optional that there may be formed interposed between the blanket first dielectric layer 14 and the blanket soft adjacent layer (SAL) 16 either a blanket or a patterned hard magnetic biasing layer contacting the blanket soft adjacent layer 16. The blanket or patterned hard magnetic biasing layer, if formed, is preferably from about 100 to about 300 angstroms thick, and preferably formed from a hard magnetic material, such as but not limited to an iron-manganese alloy hard magnetic material, a nickel-manganese alloy hard magnetic material, a cobalt-chromium alloy hard magnetic material or rare earth alloy hard magnetic material, as is conventional in the art of magnetoresistive (MR) sensor element fabrication.

With respect to the blanket first dielectric layer 14 and the blanket second dielectric spacer layer 18, although the blanket first dielectric layer 14 and the blanket second dielectric spacer layer 18 may be formed through methods and materials conventional in the art of soft adjacent layer (SAL) magnetoresistive (MR) sensor element fabrication, including but not limited to chemical vapor deposition (CVD) methods, plasma enhanced chemical vapor deposition (PECVD) methods and physical vapor deposition (PVD) sputtering methods through which may be formed dielectric layers of dielectric materials including but not limited to silicon oxide dielectric materials, silicon nitride dielectric materials, nitrogenated carbon dielectric materials and aluminum oxide dielectric materials, for the preferred embodiment of the present invention, the blanket first dielectric layer 14 and the blanket second dielectric spacer layer 18 are each preferably formed of an aluminum oxide dielectric material deposited through a physical vapor deposition (PVD) sputtering method, as is most common in the art of magnetoresistive (MR) sensor element fabrication. Preferably, the blanket first dielectric layer 14 so formed is formed to a thickness of from about 300 to about 2000 angstroms, while the blanket second dielectric spacer layer 18 so formed is preferably formed to a thickness of from about 50 to about 500 angstroms.

Figure 2:
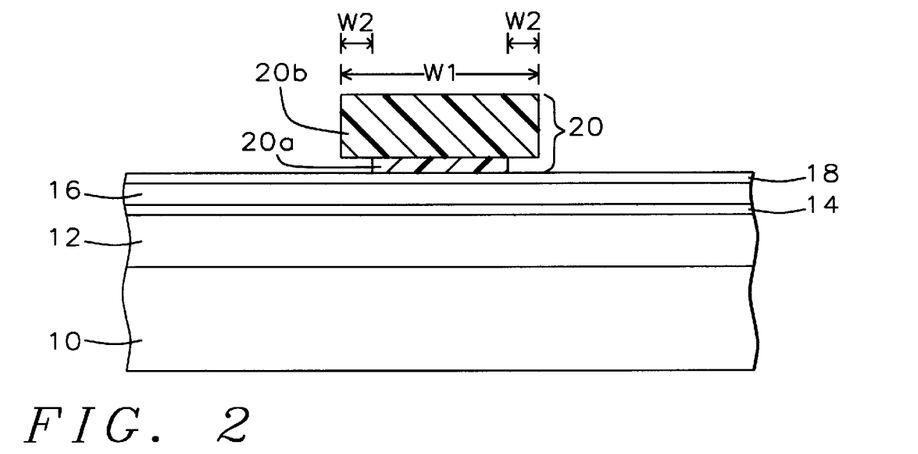

Referring now to FIG. 2, there is shown a schematic cross-sectional diagram illustrating the results of further processing of the soft adjacent layer (SAL) magnetoresistive (MR) sensor element whose schematic cross-sectional diagram is illustrated in FIG. 1. Shown in FIG. 2 is the presence of a lift off stencil 20 formed upon the blanket second dielectric spacer layer 18. The lift off stencil 20 comprises a patterned release layer 20a formed upon the blanket second dielectric spacer layer 18 and a patterned photoresist layer 20b formed symmetrically overhanging the patterned release layer 20a. While any of several release materials may be employed in forming the patterned release layer 20a, including but not limited to organic polymer release materials such as but not limited to polysulfone release materials and polyimide release materials, for the preferred embodiment of the present invention, the patterned release layer 20a is preferably formed of a polysulfone release material. Preferably, the patterned release layer 20a is formed to a thickness of from about 500 to about 10000 angstroms upon the blanket second dielectric spacer layer 18. Similarly, although any of several photoresist materials may be employed in forming the patterned first photoresist layer 22b, including but not limited to photoresist materials selected from the general groups of photoresist materials including but not limited to positive photoresist materials and negative photoresist materials, for the preferred embodiment of the present invention, the patterned photoresist layer 20b is preferably formed of a positive photoresist material in order to provide optimal dimensional integrity when forming the lift off stencil 20. Preferably, the patterned photoresist layer 20b is formed to a thickness of from about 5000 to about 20000 angstroms.

In order to fabricate the lift off stencil 20 as illustrated in FIG. 2, there is first formed upon the blanket second dielectric spacer layer 18 a blanket release layer from which is formed the patterned release layer 20a. There is then formed upon the blanket release layer a blanket photoresist layer from which is formed the patterned photoresist layer 20b. The patterned photoresist layer 20b is then photoexposed and developed from the blanket photoresist layer. Finally, the patterned release layer 20a is formed through etching the blanket release layer within an isotropic etchant (typically an organic solvent) while employing the patterned photoresist layer 20b as a mask for a sufficient time to provide the uniform overhang of the patterned photoresist layer 20b with respect to the patterned release layer 20a. Preferably, the patterned photoresist layer 20b has a width W1 over the blanket second dielectric spacer layer 18 of from about 1.0 to about 10 microns, as illustrated in FIG. 2, while the patterned photoresist layer 20b symetrically overhangs each edge of the patterned release layer 20a by a width W2 of from about 0.1 to about 2.0 microns, as similarly illustrated in FIG. 2.

Figure 3:
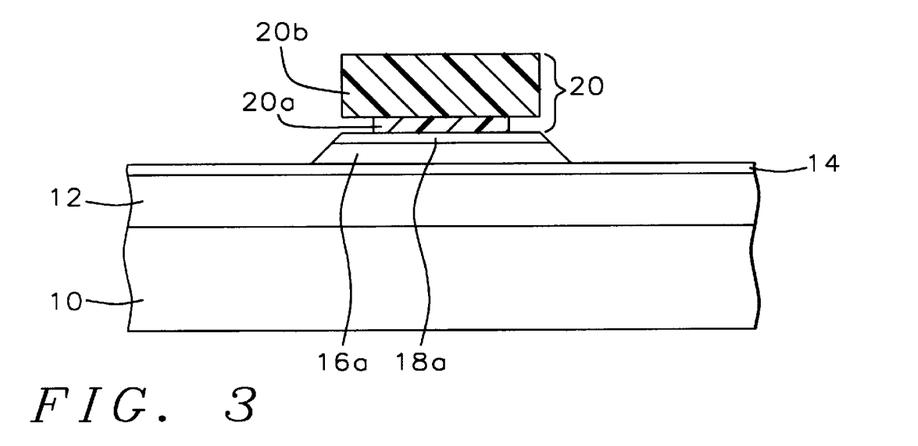

Referring now to FIG. 3, there is shown a schematic cross-sectional diagram illustrating the results of further processing of the soft adjacent layer (SAL) magnetoresistive (MR) sensor element whose schematic cross-sectional diagram is illustrated in FIG. 2.

Shown first in FIG. 3 is the results of sequentially etching while employing the lift off stencil 20 as an etch mask the blanket second dielectric spacer layer 18 and the blanket soft adjacent layer (SAL) 16 to form a corresponding patterned soft adjacent layer (SAL) 16a having formed thereupon a corresponding patterned second dielectric spacer layer 18a. The foregoing blanket layers may be etched to form the corresponding patterned layers while employing the lift off stencil 20 as an etch mask while employing etch methods as are conventional in the art of magnetoresistive (MR) sensor element fabrication, including but not limited to ion beam etch (IBE) methods, reactive ion beam etch (RIBE) methods, sputter etch methods and reactive sputter etch methods. For the first preferred embodiment of the present invention the foregoing blanket layers are preferably etched to form the corresponding patterned layers through an ion beam etch (IBE) method employing argon ions, as is common in the art of magnetoresistive (MR) sensor element fabrication. The ion beam etch (IBE) method preferably etches completely through the blanket second dielectric spacer layer 18 and the blanket soft adjacent layer (SAL) 16 while not substantially etching the blanket first dielectric layer 14. The ion beam etch (IBE) method may be monitored and controlled through residual gas analysis methods and optical emission spectroscopy analysis methods as are conventional in the art.

As is illustrated in FIG. 3, the bilayer stack formed from the pattened soft adjacent layer (SAL) 16a and the patterned second dielectric spacer layer 18a is typically formed with an outward taper of from about zero to about 45 degrees with respect to the orthogonal to the substrate 10, as is common in the art of ion beam etch (IBE) methods employed within magnetoresistive (MR) sensor element fabrication. Such outward taper typically occurs due to redeposition upon the lift off stencil 20 of material sputtered from the blanket second dielectric spacer layer 18 and the blanket soft adjacent layer (SAL) 16, along with the redeposited sputtered material's consequential shadowing of the ion beam employed within the ion beam etch (IBE) method. Alternative etch methods may provide a patterned second dielectric spacer layer 18a and a patterned soft adjacent layer 16a stack with less taper. Thus, within the context of the method of the present invention, patterned soft adjacent layers such as the patterned soft adjacent layer (SAL) 16a and patterned dielectric spacer layers such as the patterned second dielectric spacer layer 18a are generally at least substantially co-extensive. In that regard, use of the term "substantially co-extensive" within the specification and the claims is intended to accommodate the slight positive tapering inherently observed within patterned layers formed through etch methods such as but not limited to conventional ion beam etch (IBE) methods employed in forming those patterned layers within magnetoresistive (MR) sensor elements.

Figure 4:
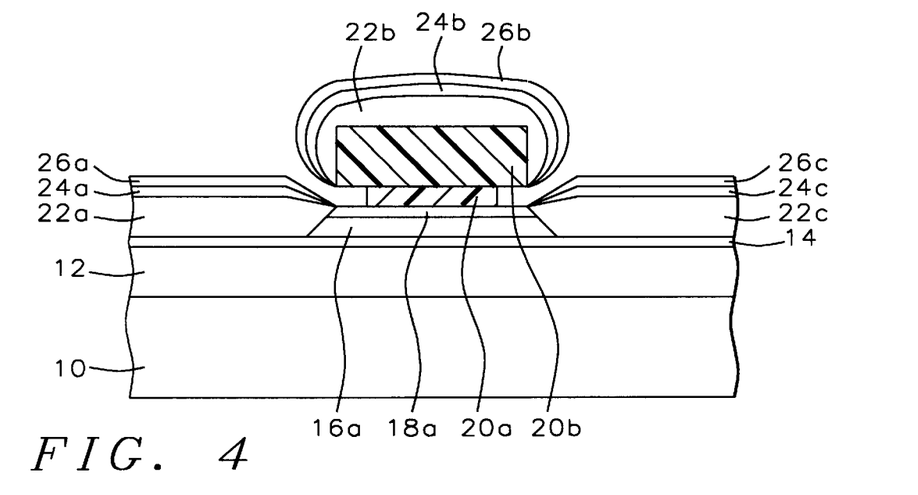

Referring now to FIG. 4, there is shown a schematic cross-sectional diagram illustrating the results of further processing of the soft adjacent layer (SAL) magnetoresistive (MR) sensor element whose schematic cross-sectional diagram is illustrated in FIG. 3. Shown in FIG. 4 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 3, but upon whose surface is formed: (1) a pair patterned third dielectric backfill layers 22a and 22c formed upon exposed portions of the blanket first dielectric layer 14; (2) a pair of patterned conductor lead layers 24a and 24c formed upon the pair of patterned third dielectric backfill layers 22a and 22c; (3) a pair of patterned antiferromagnetic longitudinal magnetic biasing layers 26a and 26c (or alternatively a pair of patterned permanent magnetic biasing layers) formed upon the corresponding patterned conductor lead layers 24a and 24c; and (4) a stack of a patterned third dielectric backfill layer residue 22b, a patterned conductor lead layer residue 24b and a patterned anti-ferromagnetic longitudinal magnetic biasing layer residue 26b formed upon the patterned photoresist layer 20b within the lift off stencil 20.

Within the first preferred embodiment of the present invention, the patterned third dielectric backfill layers 22a and 22c and the patterned third dielectric backfill layer residue 22b are preferably formed through methods and materials analogous or equivalent to the methods and materials employed in forming the blanket first dielectric layer 14 and the blanket second dielectric spacer layer 18 as illustrated in FIG. 1. Preferably, the patterned third dielectric backfill layers 22a and 22c are each formed to a thickness sufficient to fully encapsulate the exposed edges of the patterned soft adjacent layer (SAL) 16a and the patterned second dielectric spacer layer 18a, which will preferably provide patterned third dielectric backfill layers 22a and 22c of from about 200 to about 2000 angstroms thickness each. Alternative deposition methods employed in forming the patterned third dielectric backfill layers 22a and 22c will typically provide slight variations in the level of encapsulation of the exposed edges of the patterned soft adjacent layer 16a and the patterned second dielectric spacer layer 18a.

With respect to the patterned conductor lead layers 24a and 24c, the patterned conductor lead layer residue 24b, the patterned antiferromagnetic longitudinal magnetic biasing layers 26a and 26c and the patterned antiferromagnetic longitudinal magnetic biasing layer residue 26b, methods and materials through which antiferromagnetic longitudinal magnetic biasing layers and conductor lead layers may be formed within magnetoresistive (MR) sensor elements are generally known in the art of magnetoresistive (MR) sensor element fabrication. In that regard, antiferromagnetic longitudinal magnetic biasing layers and conductor lead layers are typically, although not exclusively, formed within magnetoresistive (MR) sensor elements through methods including but not limited to thermally assisted evaporation methods, electron beam assisted evaporation methods and physical vapor deposition (PVD) sputtering methods. In addition, antiferromagnetic longitudinal magnetic biasing layers are typically formed within magnetoresistive (MR) sensor elements from hard magnetic materials such as but not limited to iron-manganese alloy hard magnetic materials, nickel-manganese alloy hard magnetic materials, chromium-cobalt alloy hard magnetic materials and rare earth alloy hard magnetic materials. Similarly, conductor lead layers are typically formed within magnetoresistive (MR) sensor elements from conductor materials including but not limited to aluminum, aluminum alloy, copper, copper alloy, gold and gold alloy conductor materials. For the first preferred embodiment of the soft adjacent layer (SAL) magnetoresistive (MR) sensor element of the present invention, the patterned conductor lead layers 24a and 24c, and the patterned conductor lead layer residue 24b are each preferably formed of a gold or gold alloy conductor material formed to a thickness of from about 300 to about 1000 angstroms, as is common in the art of magnetoresistive (MR) sensor element fabrication. Similarly, for the first preferred embodiment of the soft adjacent layer (SAL) magnetoresistive (MR) sensor element of the present invention, the patterned antiferromagnetic longitudinal magnetic biasing layers 26a and 26c, and the patterned antiferromagnetic longitudinal magnetic biasing layer residue 26b, are each preferably formed of an iron-manganese (50:50 w/w) or nickel-manganese antiferromagnetic material formed to a thickness of from about 100 to about 1000 angstroms, as is similarly also common in the art of magnetoresistive (MR) sensor element fabrication.

Figure 5:
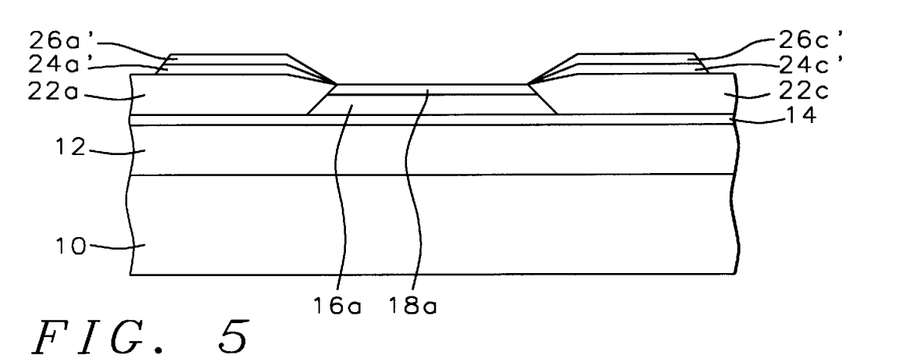

Referring now to FIG. 5, there is shown a schematic cross-sectional diagram illustrating the results of further processing of the soft adjacent layer (SAL) magnetoresistive (MR) sensor element whose schematic cross-sectional diagram is illustrated in FIG. 4. Shown in FIG. 5 is a schematic cross-sectional diagram of a soft adjacent layer (SAL) magnetoresistive (MR) sensor element largely equivalent to the soft adjacent layer (SAL) magnetoresistive (MR) sensor element whose schematic cross-sectional diagram is illustrated in FIG. 4, but wherein: (1) there has been stripped from the patterned second dielectric spacer layer 18a the lift off stencil 20 which simultaneously removes with it the patterned third dielectric backfill layer residue 22b, the patterned conductor lead layer residue 24b and the patterned antiferromagnetic longitudinal magnetic biasing layer residue 26b; and (2) the pair of patterned conductor lead layers 24a and 24c and the pair of patterned antiferromagnetic longitudinal magnetic biasing layers 26a and 26c have been additionally patterned to form a pair of etched patterned conductor lead layers 24a' and 24c' having formed and aligned thereupon a corresponding pair of etched patterned antiferromagnetic longitudinal magnetic biasing layers 26a' and 26c'.

The first lift off stencil 20 is preferably stripped from the soft adjacent layer (SAL) magnetoresistive (MR) sensor element whose schematic cross-sectional diagram is illustrated in FIG. 4 to provide in part the soft adjacent layer (SAL) magnetoresistive (MR) sensor element whose schematic cross-sectional diagram is illustrated in FIG. 5 through methods as are conventional in the art of lift off stencil fabrication and removal, which methods will typically employ organic solvent materials, such as but no limited to acetone, tetrahydrofuran (THF) and N-methylpyrrolidone solvent materials. Similarly, the patterned conductor lead layers 24a and 24c and the patterned antiferromagnetic longitudinal magnetic biasing layers 26a and 26c are additionally patterned to form the pair of etched patterned conductor lead layers 24a' and 24c' having formed and aligned thereupon the corresponding pair of etched patterned antiferromagnetic longitudinal magnetic biasing layers 26a' and 26c' through etch methods analogous or equivalent to the etch methods through which the patterned soft adjacent layer (SAL) 16a and the patterned second dielectric spacer layer 18a are formed from the corresponding blanket soft adjacent layer 16 and blanket second dielectric spacer layer 18.

Figure 6:
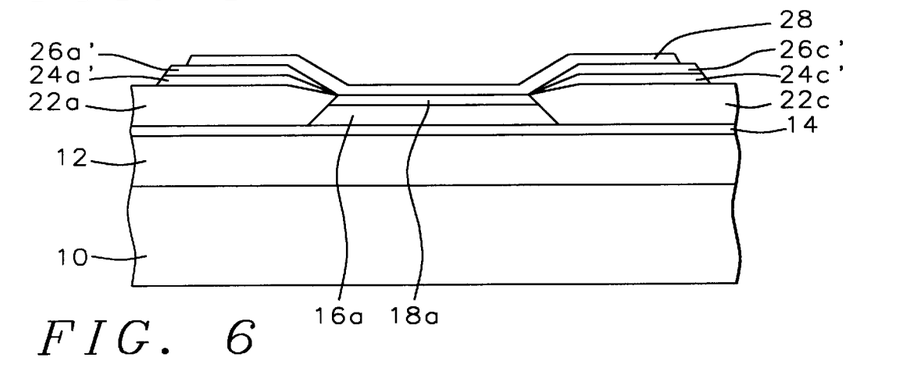

Referring now to FIG. 6, there is shown a schematic cross-sectional diagram illustrating the results of further processing of the soft adjacent layer (SAL) magnetoresistive (MR) sensor element whose schematic cross-sectional diagram is illustrated in FIG. 5. Shown in FIG. 6 is a schematic cross-sectional diagram of a soft adjacent layer (SAL) magnetoresistive (MR) sensor element otherwise equivalent to the soft adjacent layer (SAL) magnetoresistive (MR) sensor element whose schematic cross-sectional diagram is illustrated in FIG. 6, but upon whose surface is formed a patterned magnetoresistive (MR) layer 28. As is illustrated within the schematic cross-sectional diagram of FIG. 6, neither the upper surface of the patterned magnetoresistive (MR) layer 28 nor the lower interface of the patterned magnetoresistive (MR) layer 28 (i.e., with at least the patterned dielectric spacer layer 18a and the pair of etched patterned antiferromagnetic longitudinal magnetic biasing layers 26a' and 26b') is planar. Methods and materials through which patterned magnetoresistive (MR) layers may be formed within magnetoresistive (MR) sensor elements are known within the art of magnetoresistive (MR) sensor element fabrication. Patterned magnetoresistive (MR) layers may be formed within magnetoresistive (MR) sensor elements through deposition methods including but not limited to thermally assisted deposition methods, electron beam assisted deposition methods and physical vapor deposition (PVD) sputtering methods followed by etch methods including but mot limited to ion beam etch (IBE) methods, reactive ion beam etch (RIBE) methods, sputter etch methods and reactive sputter etch methods through which may be formed patterned magnetoresistive (MR) layers of magnetoresistive (MR) materials including but no limited to permalloy (ie: nickel-iron) alloy magnetoresistive (MR) materials and higher order alloy magnetoresistive (MR) materials incorporating permalloy magnetoresistive (MR) materials. For the first preferred embodiment of the present invention, the patterned magnetoresistive (MR) layer 28 is preferably formed from a blanket magnetoresistive (MR) layer formed of a permalloy (ie: nickel-iron 80:20, w/w) magnetoresistive (MR) material formed to a thickness of from about 50 to about 500 angstroms upon the soft adjacent layer (SAL) magnetoresistive (MR) sensor element whose schematic crosssectional diagram is illustrated in FIG. 5 and subsequently patterned through an ion beam etch (IBE) method, as are most common in the art of magnetoresistive (MR) sensor element fabrication.

As is understood by a person skilled in the art, it is advantageous within both the present invention and the first preferred embodiment of the present invention that the blanket shield layer 12, and in particular the patterned soft adjacent layer (SAL) 16a and the patterned magnetoresistive (MR) layer 28 may simultaneously be formed from the same soft magnetic material. Such advantage may provide substantial manufacturing efficiency and economy when fabricating a soft adjacent layer (SAL) magnetoresistive (MR) sensor element in accord with the present invention. Significantly, such advantage is inherently not realized within soft adjacent layer (SAL) magnetoresistive (MR) sensor elements where a soft adjacent layer (SAL) contacts a magnetoresistive (MR) layer within the soft adjacent layer (SAL) magnetoresistive (MR) sensor element.

Figure 7:
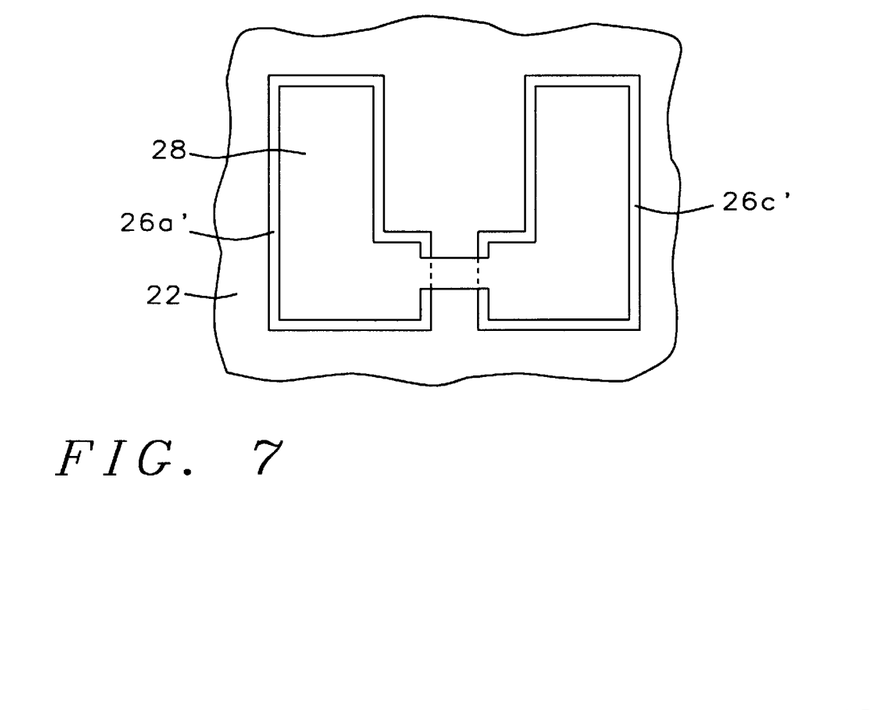
FIG. 7 shows a schematic plan-view diagram of a soft adjacent layer (SAL) magnetoresistive (MR) sensor element corresponding with the soft adjacent layer (SAL) magnetoresistive (MR) sensor element whose schematic cross-sectional diagram is shown in FIG. 7.

Referring now to FIG. 7, there is shown a schematic plan-view diagram of a soft adjacent layer (SAL) magnetoresistive (MR) sensor element illustrating in part the soft adjacent layer (SAL) magnetoresistive (MR) sensor element whose schematic cross-sectional diagram is illustrated in FIG. 6. Shown in FIG. 7 is the patterned magnetoresistive (MR) layer 28 formed upon the etched patterned antiferromagnetic longitudinal magnetic biasing layers 26a' and 26c', all of which are formed largely above the patterned third dielectric backfill layer 22. The patterned soft adjacent layer 16a, the patterned second dielectric spacer layer 18a and other underlying layers within the soft adjacent layer (SAL) magnetoresistive (MR) sensor element are not shown within the schematic plan-view diagram of FIG. 7.

Upon forming the soft adjacent layer (SAL) magnetoresistive (MR) sensor element of the first preferred embodiment of the present invention in accord with the schematic cross-sectional diagram of FIG. 6 or the schematic plan-view diagram of FIG. 7, there is formed a soft adjacent layer (SAL) magnetoresistive (MR) sensor element with improved signal amplitude since there is avoided within the soft adjacent layer (SAL) magnetoresistive (MR) sensor element of the first preferred embodiment of the present invention current shunting or elemental interdiffusion of a magnetoresistive (MR) layer with a conductor spacer layer or a soft adjacent layer (SAL) contacting the magnetoresistive (MR) layer. Such signal amplitude improvement is achieved while avoiding problems inherent within the soft adjacent layer (SAL) magnetoresistive (MR) sensor element as disclosed by Beaulieu et al. and discussed within Bajorek et al., above.

In addition to the soft adjacent layer (SAL) magnetoresistive (MR) sensor element in accord with the first preferred embodiment of the present invention, there also exists a soft adjacent layer (SAL) magnetoresistive (MR) sensor element in accord with a second preferred embodiment of the present invention. A series of schematic cross-sectional diagrams illustrating the results of progressive stages in forming the soft adjacent layer (SAL) magnetoresistive (MR) sensor element in accord with the second preferred embodiment of the present invention is shown by FIG. 8 to FIG. 11.

Figure 8:
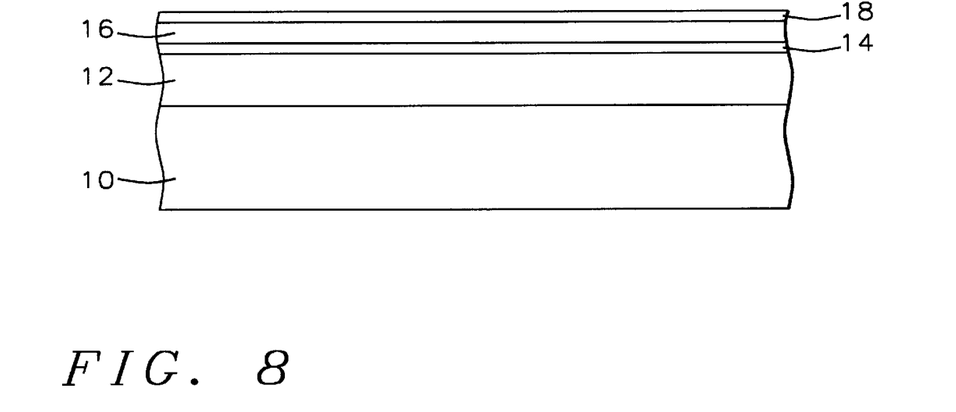
FIG. 8 to FIG. 11 show a series of schematic cross-sectional diagrams illustrating the results of progressive stages in forming a soft adjacent layer (SAL) magnetoresistive (MR) sensor element in accord with a second preferred embodiment of the present invention.
Figure 9:
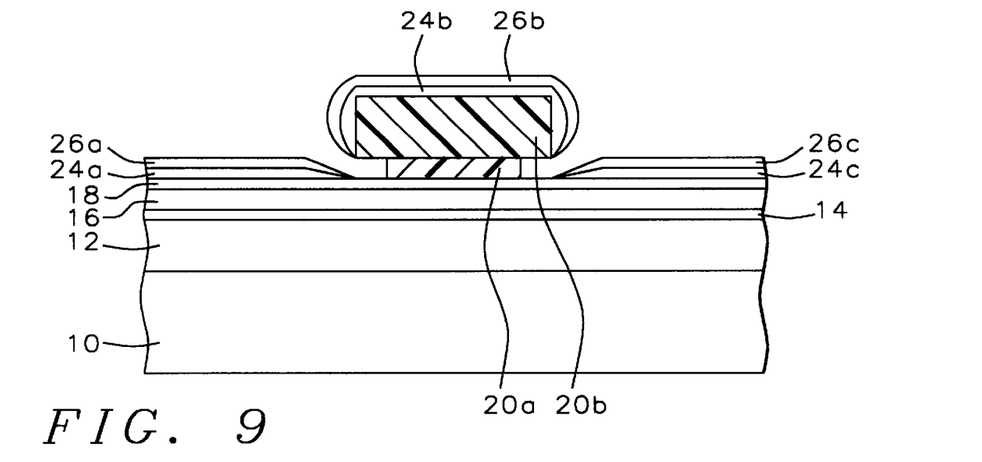
Figure 10:
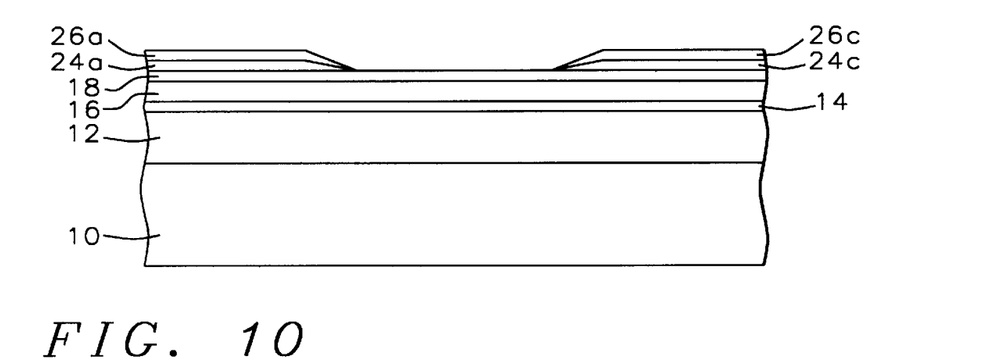
Figure 11:
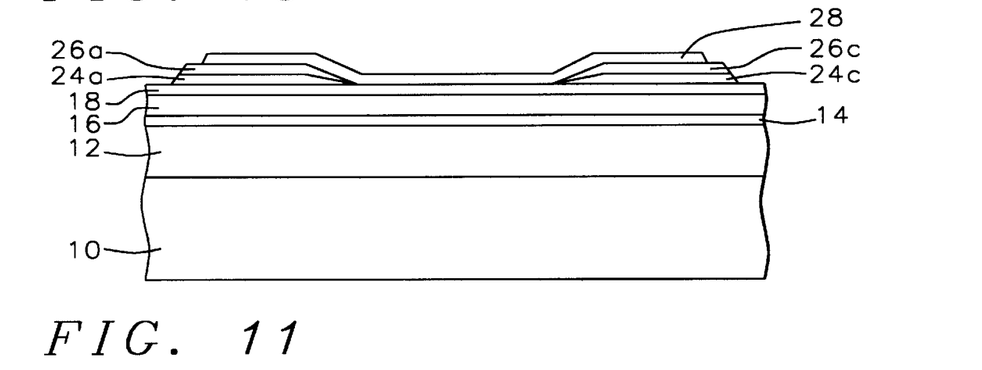
Figure 12:
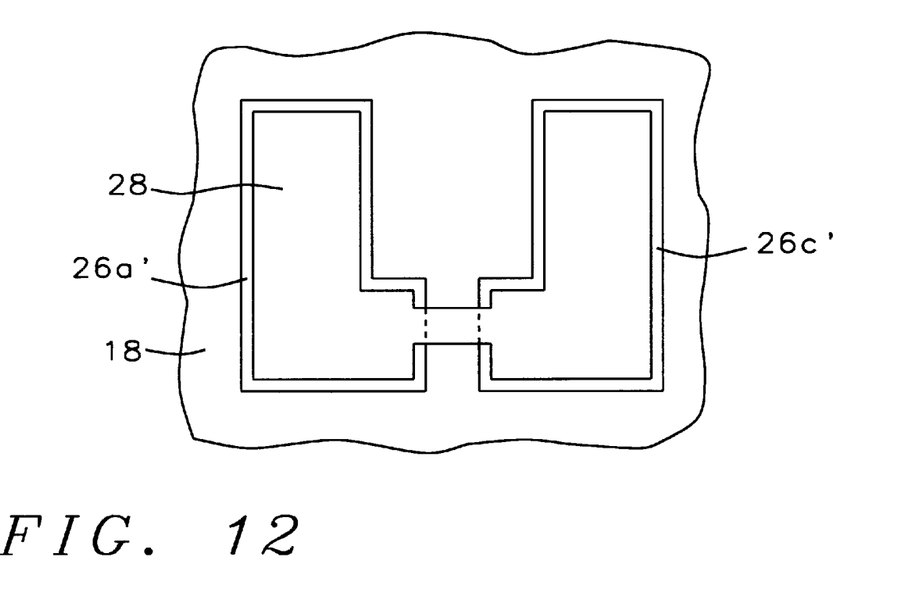
FIG. 12 shows a schematic plan-view diagram of a soft adjacent layer (SAL) magnetoresistive (MR) sensor element corresponding with the soft adjacent layer (SAL) magnetoresistive (MR) sensor element whose schematic cross-sectional diagram is shown in FIG. 11.

FIG. 8 to FIG. 11 show a series of schematic cross-sectional diagrams largely analogous with the series of schematic cross-sectional diagrams illustrating the results of progressive stages in forming the soft adjacent layer (SAL) magnetoresistive (MR) sensor element of the first preferred embodiment of the present invention, with the exception that within the second preferred embodiment of the present invention neither the blanket soft adjacent layer 16 nor the blanket second dielectric spacer layer 18 is patterned. As a result of employing within the soft adjacent layer (SAL) magnetoresistive (MR) sensor element in accord with the second preferred embodiment of the present invention the blanket soft adjacent layer (SAL) 16 and the blanket second dielectric spacer layer 18 rather than corresponding patterned layers formed from those blanket layers, there is simultaneously also avoided within the second preferred embodiment of the present invention a patterned third dielectric backfill layer, such as the patterned third dielectric backfill layers 22a and 22c as employed within the soft adjacent layer (SAL) magnetoresistive (MR) sensor element in accord with the first preferred embodiment of the present invention. Thus, although FIG. 8 therefore corresponds exactly with FIG. 1, FIG. 9 to FIG. 11 differ from FIG. 3 to FIG. 6 largely in: (1) the presence of the blanket soft adjacent layer (SAL) 16 and the blanket second dielectric spacer layer 18; and (2) the absence of the patterned third dielectric backfill layers 22a and 22c and the patterned third dielectric backfill layer residue 22b. The structures as illustrated in FIG. 9 to FIG. 11 may generally be formed through methods and materials, and with dimensions, otherwise analogous or equivalent to the methods, materials and dimensions employed in forming the corresponding structures as illustrated within FIG. 1 to FIG. 7. Similarly, while FIG. 8 illustrates a schematic plan-view diagram of structures within the soft adjacent layer (SAL) magnetoresistive (MR) sensor of the first preferred embodiment of the present invention formed above the patterned third dielectric backfill layer 22, FIG. 12 analogously illustrates a schematic plan-view diagram of structures within the soft adjacent layer (SAL) magnetoresistive (MR) sensor element of the second preferred embodiment of the present invention formed over the blanket second dielectric spacer layer 18.

For the same reasons as discussed above with respect to the soft adjacent layer (SAL) magnetoresistive (MR) sensor element fabricated in accord with the first preferred embodiment of the present invention, the soft adjacent layer (SAL) magnetoresistive (MR) sensor element fabricated in accord with the second preferred embodiment of the present invention also realizes improved signal amplitude since there is similarly also avoided within the soft adjacent layer (SAL) magnetoresistive (MR) sensor element of the second preferred embodiment of the present invention current shunting or thermal annealing induced elemental interdiffusion of a magnetoresistive (MR) layer with a conductor spacer layer or a soft adjacent layer (SAL) contacting the magnetoresistive (MR) layer.

As is understood by a person skilled in the art, there may be employed within the soft adjacent layer (SAL) magnetoresistive (MR) sensor element formed in accord with the first preferred embodiment of the present invention (whose schematic cross-sectional diagram is illustrated in FIG. 7) or the soft adjacent layer (SAL) magnetoresistive (MR) sensor element formed in accord with the second preferred embodiment of the present invention (whose schematic cross-sectional diagram is illustrated in FIG. 11) additional layers as are conventionally required or desired to form from the soft adjacent layer (SAL) magnetoresistive (MR) sensor element whose schematic cross-sectional diagram is illustrated in FIG. 7 or the soft adjacent layer (SAL) magnetoresistive (MR) sensor element whose schematic cross-sectional diagram is illustrated in FIG. 11 a soft adjacent layer (SAL) magnetoresistive (MR) read-write head. Such additional layers may include, but are not limited to, additional shield layers, additional dielectric layers, magnetic inductor layers, conductor layers, interconnection layers and passivation layers. Such additional layers may be formed through methods and materials, and with dimensions, otherwise equivalent to the methods, materials and dimensions through which such additional layers are conventionally formed within magnetoresistive (MR) read-write heads.

As is understood by a person skilled in the art, the preferred embodiments of the present invention are illustrative of the present invention rather than limiting of the present invention. Revisions and modifications may be made to materials, structures and dimensions through which is provided the soft adjacent layer (SAL) magnetoresistive (MR) sensor elements of the preferred embodiments of the present invention while still providing a soft adjacent layer (SAL) magnetoresistive (MR) sensor element within the spirit and scope of the present invention, as defined by the accompanying claims.

What is claimed is:

1. A soft adjacent layer (SAL) magnetoresistive (MR) sensor element comprising:
   a substrate;
   a soft adjacent layer (SAL) formed over the substrate;
   a dielectric layer formed upon the soft adjacent layer (SAL); and
   a magnetoresistive (MR) layer formed at least in part upon the dielectric layer, wherein:
   the soft adjacent layer (SAL) and the dielectric layer are planar; and
   neither an upper surface of the magnetoresistive (MR) layer nor a lower interface of the magnetoresistive (MR) layer is planar, such as to provide the soft adjacent layer magnetoresistive sensor element with an enhanced signal amplitude.

2. The soft adjacent layer (SAL) magnetoresistive (MR) sensor element of claim 1 wherein:
   the soft adjacent layer (SAL) is a patterned soft adjacent layer (SAL) and the dielectric layer is a patterned dielectric layer; and
   the patterned soft adjacent layer (SAL) and the patterned dielectric layer are at least substantially co-extensive.

3. The soft adjacent layer (SAL) magnetoresistive (MR) sensor element of claim 1 wherein:
   the magnetoresistive (MR) layer is formed from a magnetoresistive (MR) material chosen from the group of magnetoresistive (MR) materials consisting of permalloy alloy magnetoresistive materials and higher order alloys incorporating permalloy alloy magnetoresistive materials;
   the dielectric layer is formed from a dielectric material selected from the group of dielectric materials consisting of aluminum oxide dielectric materials, silicon oxide dielectric materials and nitrogenated carbon dielectric materials; and
   the soft adjacent layer (SAL) is formed from a soft magnetic material selected from the group of soft magnetic materials consisting of permalloy alloy soft magnetic materials and higher order alloys incorporating permalloy alloy soft magnetic materials.

4. The soft adjacent layer (SAL) magnetoresistive (MR) sensor element of claim 3 wherein the magnetoresistive (MR) layer and the soft adjacent layer (SAL) are formed of the same material.

5. The soft adjacent layer (SAL) magnetoresistive (MR) sensor element of claim 1 further comprising a hard magnetic material layer formed beneath and contacting the soft adjacent layer (SAL), wherein the hard magnetic material layer is formed from a hard magnetic material chosen from the group of hard magnetic materials consisting of iron-manganese alloy hard magnetic materials, nickel-manganese alloy hard magnetic materials, cobalt-chromium alloy hard magnetic materials and rare earth alloy hard magnetic materials.

6. The soft adjacent layer (SAL) magnetoresistive (MR) sensor element of claim 1 further comprising a pair of patterned antiferromagnetic longitudinal magnetic biasing layers formed contacting opposite ends of the magnetoresistive (MR) layer, where the pair of patterned antiferromagnetic longitudinal magnetic bias layers is formed of a hard magnetic material selected from the group of hard magnetic materials consisting of iron-manganese alloy hard magnetic materials, cobalt-chromium alloy hard magnetic materials and rare earth alloy hard magnetic materials.

7. A soft adjacent layer (SAL) magnetoresistive (MR) read-write head having fabricated therein the soft adjacent layer (SAL) magnetoresistive (MR) sensor element of claim 1.

8. The soft adjacent layer (SAL) magnetoresistive (MR) sensor element of claim 2 further comprising a patterned dielectric backfilling layer passivating a series of at least substantially co-aligned edges of the patterned soft adjacent layer (SAL) and the patterned dielectric layer which are at least substantially co-extensive.

* * * * *